United States Patent
Kuppuswamy et al.

(10) Patent No.: US 8,888,965 B2
(45) Date of Patent: Nov. 18, 2014

(54) NON-STOICHIOMETRIC TITANIUM NITRIDE FILMS

(75) Inventors: Anantha Padmanabhan Kuppuswamy, Tamil Nadu (IN); Ghanashyam Krishna Mamidipudi, Andhra Pradesh (IN); Sri Rama Narasimha Kiran Mangalampalli, Andhra Pradesh (IN)

(73) Assignees: Anna University—Chennai, Tamii, Nadu (IN); University of Hyderabad, Andhra Pradesh (IN)

( * ) Notice: Subject to any disclaimer, the term of this patent is extended or adjusted under 35 U.S.C. 154(b) by 207 days.

(21) Appl. No.: 12/745,263

(22) PCT Filed: Nov. 27, 2008

(86) PCT No.: PCT/IN2008/000789
§ 371 (c)(1),
(2), (4) Date: Aug. 27, 2010

(87) PCT Pub. No.: WO2009/069150
PCT Pub. Date: Jun. 4, 2009

(65) Prior Publication Data
US 2010/0323205 A1    Dec. 23, 2010

(30) Foreign Application Priority Data
Nov. 30, 2007  (IN) .......................... 2833/CHE/2007

(51) Int. Cl.
*C23C 14/00* (2006.01)
*C23C 14/32* (2006.01)
*C23C 14/06* (2006.01)

(52) U.S. Cl.
CPC ......... *C23C 14/0641* (2013.01); *C23C 14/0015* (2013.01)
USPC ............ 204/192.26; 204/192.12; 204/192.15; 204/192.16

(58) Field of Classification Search
CPC ............ C23C 14/0015; C23C 14/0094; C23C 14/0641; C23C 14/0617
USPC .............. 204/192.12, 192.15, 192.26, 192.16
See application file for complete search history.

(56) References Cited

U.S. PATENT DOCUMENTS

| | | | |
|---|---|---|---|
| 5,071,693 A | 12/1991 | Sue et al. | |
| 5,185,211 A * | 2/1993 | Sue et al. | 428/472 |
| 5,665,210 A * | 9/1997 | Yamazaki | 438/3 |
| 5,798,182 A | 8/1998 | LeFebvre et al. | |
| 5,919,342 A * | 7/1999 | Ngan | 204/192.22 |
| 6,238,527 B1 * | 5/2001 | Sone et al. | 204/192.12 |

FOREIGN PATENT DOCUMENTS

| | | |
|---|---|---|
| GB | 2 135 337 A | 8/1984 |
| JP | 02254166 A * | 10/1990 |

OTHER PUBLICATIONS

Translation of JP02254166.*
Lemperiere G et al: "Influence of the nitrogen partial pressure on the properties of d.c.-sputtered titanium and titanium nitride films" Thin Solid Films, Elsevier-Sequoia S.A. Lausanne, CH, vol. 111, No. 4, Jan. 27, 1984, pp. 339-349, XP024576010 ISSN: 0040-6090 [retrieved on Jan. 27, 1984].
Tanaka T et al: "Preparation of TiNx thin films using r.f.-d.c. coupled magnetron sputtering in Ar—N2 gas plasma" Thin Solid Films, Elsevier-Sequoia S.A. Lausanne, CH, vol. 317, No. 1-2, Apr. 1, 1998, pp. 93-95, XP004147617 ISSN: 0040-6090.

* cited by examiner

*Primary Examiner* — Michael Band
(74) *Attorney, Agent, or Firm* — Ladas & Parry LLP

(57) ABSTRACT

The present application relates to a process for the manufacture of transparent, large band gap, high refractive index and high temperature stable, non-stoichiometric titanium nitride thin film ($TiN_x$ $0.1<x\leq1.0$) for optical and optoelectronic devices comprising the steps of preparing the said film by magnetron sputtering in a mixture of argon and nitrogen atmosphere, as a thin layer on a substrate selected from stainless steel, amorphous fused silica, magnesium oxide, lanthanum aluminate and sodium borosilicate glass, the deposition of the said layer of the substrate being carried out at temperature between ambient and 873 K, the deposition being controlled by varying the nitrogen pressure. The invention also provides films prepared by this process and substrates coated with such films.

7 Claims, No Drawings

NON-STOICHIOMETRIC TITANIUM NITRIDE FILMS

FIELD OF THE INVENTION

The present invention provides a non-stoichiometric titanium nitride film ($TiN_x$: where $0.1 \leq x \leq 1.0$). The present invention also provides a method for the manufacture of a non-stoichiometric titanium nitride film represented by $TiN_x$ deposited on a substrate where $0.1 \leq x \leq 1.0$. The present invention also includes within its scope the use of titanium nitride ($TiN_x$ $0.1 \leq x \leq 1.0$) in optical and optoelectronic devices.

BACKGROUND OF THE INVENTION

Titanium nitride films are extremely important in a wide variety of applications due to its different characteristics such as extreme hardness, abrasion resistance, high melting temperature, high corrosion resistance and electrical conductivity. For example, titanium nitride films are used as wear-resistant coatings for cutting tools and other mechanical parts, and for high temperature structural materials, in the microelectronic industry, for use as diffusion barriers in electronic devices, particularly against diffusion between aluminum and silicon, and as planarization and interconnect material, particularly in multi-level metallization schemes.

A review of technical literature in the past several years shows that there is great interest in new coatings and surface treatment, particularly in use of titanium nitride for forming films Titanium nitride films prepared on silicon are widely used as diffraction barrier layers in large-scale integrated circuits. TiN film is also remarkably hard and is used as a wear-resistant coating on tools since it decreases the rate of abrasive wear during the cutting process as well as the chemical interaction between the tool and the work piece because of its chemical inertness. TiN is a very stable compound that enhances the pitting resistance of many substrate materials in most environments.

There are a wide variety of techniques for synthesizing titanium nitride films on different substrates. Prior techniques for synthesizing titanium nitride films include chemical vapor deposition and sputtering (H. Itoh et al., "Chemical Vapour Deposition of Corrosion-Resistant TiN Film to the Inner Walls of Long Steel Tubes," J. Mat. Sci., 21, 751-56 (1986) and D. S. Williams et al., "Nitrogen, Oxygen, and Argon Incorporation During Reactive Sputter Deposition of Titanium Nitride," J. Vac. Sci. Technol. B, 5, 1723-29 (1987)).

It is also known in the art to use ion implantation to apply a titanium nitride film to the surface of a substrate (B. Rauschenbach, "Formation of Compounds by High-Flux Nitrogen Ion Implantation in Titanium," J. Mat. Sci., 21, 395-404 (1986), M. Belii et al., Formation of Chemical Compounds by Ion Bombardment of Thin Transition Metal Films," Phys. Status Solidi A, 45, 343-52 (1978), and P. A. Chen et al., "Titanium Nitride Films Prepared by Ion Implantation," Thin Solid Films, 82, L91-92 (1981)).

It is also known in the art to use pyrolysis of preceramic polymers resulting in synthesis of titanium nitride films by slow heating of sol-gel derived titanium oxide films in ammonium gas (D. Seyferth et al., "Preparation of Titanium Nitride and Titanium Carbonitride by the Pre-ceramic Polymer Route," J. Mat. Sci. Lett., 7, 487-88 (1988)). Kamiya, et al., "Nitridation of the Sol-gel Derived Titanium Oxide Films by Heating in Ammonia Gas", J. Am. Cerm. Soc., 73, 2750-52 (1980)).

However, the above procedures are subject to limitations dictated often by the size or shape of the substrate. These limitations limit the use of titanium nitride films particularly where planarization and/or the filling of vias in multilevel metallization are required. Another disadvantage of these methods is that the resulting titanium nitride films may contain high levels of impurities, such as oxygen, which in turn adversely affect the desired characteristics of the final product. For example, the level of oxygen in the nonstoichiometric films deposited by Kamiya et al result in decreased conductivity and decreased barrier efficiency.

The thermal growth method for film formation/deposition on a substrate comprises heating the wafer substrate at temperatures which are controlled very precisely, typically between 800 and 1200° C., with a choice of ambient gases. The high temperature promotes the reaction between the ambient gas and the wafer substrate. For instance, films of silicon dioxide are often produced by this method. The problem with this method is the extremely high deposition temperatures required. Extremely high temperatures are a concern for two reasons. First, high temperature may be incompatible with or even detrimental to other elements of the integrated circuit, and, second, excessive cycling from low to high temperatures can damage a circuit, thereby reducing the percentage of reliable circuits produced from a wafer. Therefore, a lower deposition temperature is always preferred so that the characteristics of the deposited film are unaffected. As a result, the thermal growth method is not preferred for the formation of TiN films particularly in the case of IC's.

In sputter deposition, the material to be deposited is bombarded with positive inert ions. If the energy of the incident ions exceeds the surface binding energy, atoms are ejected into the gas phase where they are subsequently deposited on to the substrate, which may or may not be negatively biased. Sputter deposition has been widely used in integrated circuit processes to deposit titanium-containing films. The primary disadvantage of sputter deposition is that it results in films having poor step coverage, so it may not be widely useable in submicron processes. Films deposited by sputter deposition on slanted or vertical surfaces do not exhibit uniform thickness, and the density of films deposited on these surfaces is usually not as high as the films deposited on horizontal surfaces.

In spin-on deposition, the material to be deposited is mixed with a suitable solvent and spun on to the substrate. The primary disadvantage of spin-on deposition is that nominal uniformity can only be achieved at relatively high thicknesses. Therefore, this method is primarily used for the deposition of photoresist and the like. It is generally not useful for the deposition of thin films.

Of the various methods discussed above, chemical vapor deposition and plasma enhanced chemical vapor deposition are suitable for formation of the thinnest films with a greater degree of uniformity.

In CVD, the gas phase reduction of highly reactive chemicals under low pressure results in very uniform thin films. A basic CVD process used for depositing titanium containing compound involves a given composition of reactant gases and a diluent which are injected into a reactor containing one or more silicon wafers. The reactor is maintained at selected pressures and temperatures sufficient to initiate a reaction between the reactant gases. The reaction results in the deposition of a thin film on the wafer. If the gases include hydrogen and a titanium precursor, a titanium-containing film will be deposited. For example, if, in addition to hydrogen and the titanium precursor, the reactor contains a sufficient quantity of nitrogen or a silane, the resulting titanium-containing film will be titanium nitride and titanium silicide respectively. Plasma enhanced CVD is a form of CVD that includes bombarding the material to be deposited with a plasma to generate chemically reactive species at relatively low temperatures.

Chemical vapor deposition is typically carried out in one of two types of reactors. One type of reactor is called a hot wall reactor. A hot wall reactor is operated at a low pressure, typically 1 Torr or less, and high temperatures, typically 600° C. or greater. The other type of reactor is called a cold wall reactor. A cold wall reactor is operated at atmospheric pressure and low temperatures, typically 400 to 600° C.

Films produced by these techniques, however, often exhibit poor adhesion to the substrate. Coupled with this problem is the requirement of high deposition temperature (>500° C.) for effective formation of TiN film and relatively long duration of time required for thin film formation. In many of these techniques, the plasma dimensions, and subsequently, substrate size also limit the process of film deposition.

U.S. Pat. No. 4,514,437 to Prem Nath, issued Apr. 30, 1985, discloses a method and apparatus for depositing thin films, such as indium tin oxide, onto substrates. The deposition comprises one step in the fabrication of electronic, semiconductor and photovoltaic devices. An electron beam is used to vaporize a source of solid material, and electromagnetic energy is used to provide an ionizable plasma from reactant gases. By passing the vaporized solid material through the plasma, it is activated prior to deposition on to a substrate. In this manner, the solid material and the reactant gases are excited to facilitate their interaction prior to the deposition of the newly formed compound on to the substrate.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

U.S. Pat. No. 4,976,839 to Minoru Inoue, issued Dec. 11, 1990 discloses a titanium nitride barrier layer of 500 Å to 2,000 Å in thickness formed by reactive sputtering in a mixed gas including oxygen in a proportion of 1% to 5% by volume relative to the other gases, comprising an inert gas and nitrogen. The temperature of the silicon substrate during deposition of the titanium nitride barrier layer ranged between about 350° C. and about 500° C. during the sputtering, and the resistivity of the titanium nitride film was "less than 100 $\mu\Omega$-cm", with no specific numbers other than the 100 $\mu\Omega$-cm given.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. One of the examples given is for titanium nitride film deposition using reactive sputtering, where a titanium cathode is used in combination with plasma formed from a combination of argon and nitrogen gases. The resistivity of the films produced ranged from about 200 $\mu\Omega$-cm to about 75 $\mu\Omega$-cm, where higher ion energies were required to produce the lower resistivity films. The higher the ion energy, the more highly stressed the films, however. Peeling of the film was common at thicknesses over 700 Å, with depositions on circuit topography features delaminating upon cleaving.

U.S. patent application Ser. No. 08/511,825 of Xu et al. filed Aug. 7, 1995, assigned to the Assignee of that invention, and incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods.

U.S. Pat. No. 5,202,152 discloses that a substantially stoichiometric film of titanium nitride is provided by heating a substrate upon which a solution containing titanium has been applied at a substantially ambient temperature to provide a gel-film containing titanium on the surface of the substrate in an ammonia atmosphere. The substrate is heated to a temperature at which the titanium in the titanium-containing gel-film is substantially completely transformed to a substantially stoichiometric titanium nitride film, and at a rate of temperature change that is great-enough to prevent the formation of nonstoichiometric titanium nitride compounds or other undesired titanium compounds in the resulting titanium nitride film.

While there are several references in the art to the manufacture of TiN stoichiometric films as well as non-stoichiometric films, it has hitherto been believed that non-stoichiometric films would not be usable due to several disadvantages such as decrease in corrosion resistance, difficulty in deposition, formation of stoichiometric phase during annealing, difficulty in controlling operational parameters required to maintain characteristics of the TiNx films such as resistivity, thickness and the like. It was also believed that the film quality of non-stoichiometric films formed in the art show 'pin holes' reflecting expected columnar growth processes and therefore would not be usable for most applications.

OBJECTS OF THE INVENTION

The main object of the invention is to provide a non-stoichiometric $TiN_x$ (0.1≤x≤1.0) film with enhanced properties of color reflectance, different optical, optoelectronic properties, hardness, resistivity and the like.

It is another object of the invention to provide nano-films of non-stoichiometric titanium nitride which would demonstrate the same, if not enhanced, properties as stoichiometric titanium nitride films.

SUMMARY OF THE INVENTION

Accordingly, the present invention provides a process for the manufacture of transparent, large band gap, high refractive index and high temperature stable, non-stoichiometric titanium nitride thin film ($TiN_x$ 0.1≤x≤1.0) for optical and optoelectronic devices comprising the steps of preparing the said film by magnetron sputtering in a mixture of argon and nitrogen atmosphere or pure nitrogen atmosphere, as a thin layer on a substrate selected from stainless steel, amorphous fused silica, magnesium oxide, lanthanum aluminate and sodium borosilicate glass, the deposition of the said layer of the substrate being carried out at temperature between ambient and 873 K, the said deposition being controlled by varying the nitrogen gas partial pressure.

In one embodiment, the TiNx layers are formed at a pressure of 15 m Torr on stainless steel substrates.

In another embodiment, the gas pressure is varied from 12 to 25 mTorr to control the porosity and thickness (10 to 100 nm) and obtain films of hardness in the range of 5 to 7.5 GPa.

In yet another embodiment, the film obtained by the process results in transparent, large band gap, high refractive index and high temperature stable, non-stoichiometric titanium nitride thin film (TiN$_x$ 0.1≤x≤1.0).

In yet another embodiment of the invention, the films of the invention show large band gap, high refractive index and are stable at high temperatures and show transmission of close to 80%.

In yet another embodiment of the invention, the films have band gap for 3.7 to 4.5 eV.

In yet another embodiment of the invention, the films of the invention have a refractive index from 1.5 to 1.9 @ 600 nm.

In yet another embodiment of the invention, the films after deposition are annealed at 873K to obtain or enhance their optical stability.

The present invention also provides a nanofilm of non-stoichiometric titanium nitride TiNx (where TiN$_x$ 0.1≤x≤1.0), when prepared by the method described herein.

The present invention also provides a substrate whenever coated with the film of non-stoichiometric titanium nitride TiNx (where TiN$_x$ 0.1≤x≤1.0)

DETAILED DESCRIPTION OF THE INVENTION

Thin films are defined as materials with thickness in the range 10 to 100 nm. The thin films of the invention are formed by RF magnetron sputtering process in a mixture of argon and nitrogen where the amount of nitrogen is greater than 0 but can go till 100% and at power ranging from 0.5 to 3 Watts/cm$^2$. The films can withstand substrate temperatures between ambient temperature and 873 K during position and up to 873 K after deposition. The composition is controlled by varying the nitrogen pressure during deposition. Porosity is controlled to achieve almost full theoretical density by changing the gas pressure from 12 to 25 mTorr, the substrate temperature and thickness.

In the main embodiment of the TiNx layer, it is grown on stainless steel, amorphous fused silica and sodium borosilicate glass substrates. These films have high transmission, up to 80%, in the visible region of the spectrum; large band gap (3.7 to 4.5 eV) and refractive index between 1.5 and 1.9 at 600 nm wavelength. These properties are stable up to a temperature of 873 K. These properties make them suitable as one of the layers in optical interference and optical band pass filters; UV detectors etc. for space, defense and medical applications. As an example, an optical interference filter consists of alternate high refractive index and low refractive index materials. These compositions are suitable for both types of uses (i.e. high and low index). High temperature stability of the optical properties makes them suitable for high temperature optoelectronic applications.

In one embodiment, TiNx layers, grown at a pressure of 15 m Torr on stainless steel substrates, show less than 2% reflectance making them suitable for anti-reflection applications on stainless steel that can be used for stealth applications. They exhibit different colours such as Yellow, deep blue and brown which makes them suitable for jewelry and decorative applications. The films can be tailored to exhibit hardness in the range of 5 to 7.5 GPa by varying the gas pressure from 12 to 25 mTorr.

The present invention therefore provides a process for the manufacture of transparent, large band gap, high refractive index and high temperature stable, non-stoichiometric titanium nitride thin film (TiN$_x$ 0.1≤x≤1.0) for optical and optoelectronic devices.

In the method of the invention, titanium nitride thin films are formed by RF magnetron sputtering in a mixture of Argon and Nitrogen atmosphere with the percentage of Nitrogen varying from 0 to 100% at power ranging from 0.5 to 3 Watts/cm$^2$.

According to this invention, the process for manufacture of transparent, large band gap, high refractive index and high temperature stable, non-stoichiometric titanium nitride thin film (TiN$_x$ 0.1≤x≤1.0) for optical and optoelectronic devices, comprises the steps of preparing the said film by magnetron sputtering in a mixture of argon and nitrogen atmosphere as a thin layer on a substrate selected from stainless steel, amorphous fused silica, magnesium oxide, lanthanum aluminate and sodium borosilicate glass, the deposition of the said layer on the substrate being carried out at a temperature between ambient and 673 K, the deposition being controlled by varying the nitrogen pressure.

As an example, an optical interference filter consists of alternate high refractive index and low refractive index materials. These compositions are suitable for both types of uses (high and low index). High temperature stability of the optical properties makes them suitable for high temperature optoelectronic applications.

In another embodiment, TiN$_x$ (TiN$_x$ 0.1≤x≤1.0) layers, grown at a pressure of 15 m Torr on stainless steel substrates, show 2% reflectance making them suitable for anti-reflection applications on stainless steel that can be used for stealth applications. They exhibit different colours such as yellow and brown or even deep blue which make them suitable for jewelry and decorative applications. The films can be tailored to exhibit hardness in the range of 5 to 7.5 GPa by varying the gas pressure from 12 to 25 mTorr.

The film of the invention can also be used for solid state lighting such as the manufacture of light emitting diodes (LEDs).

In the prior art, stoichiometric titanium nitride thin films were known for their optical, electronic and mechanical properties. However, the present inventors are unaware of any attempt to form non-stoichiometric forms of titanium nitride as thin films with stable structure or exploiting their uses. Despite an extensive search, literature was not found which demonstrated the optical or nanomechanical properties of non-stoichiometric thin films.

The films of the invention are made by either RF based or DC based magnetron sputtering using conventional equipment and techniques. However, parameters such as nitrogen pressure, temperature and power are controlled to yield the desired film TiNx where 0.1≤x≤1.0. Typically, the atmosphere is a mixture of argon and nitrogen or pure nitrogen where the amount of nitrogen is greater than 0% but can even be 100%. The power is moderated between 0.5 to 3 watts/cm$^2$. The composition is controlled by varying nitrogen pressure during deposition and the porosity is controlled to almost 0% by changing pressure from 12 mTorr to 25 mTorr as well as by controlling substrate temperature and thickness.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. One of the examples given is for titanium nitride film deposition using reactive sputtering, where a titanium cathode is used in combination with plasma formed from a combination of argon and nitrogen gases. The process used in the present invention is significantly different from the above-mentioned process.

The present invention will now be described with reference to the following illustrative and non-limiting examples.

EXAMPLE 1

Different $TiN_x$ (where $0.1 \leq x \leq 1.0$) were formed on different substrates selected from fused silica, 316LN nuclear grade steel. The method involved RF magnetron sputtering in a mixture of Argon and Nitrogen atmosphere with the percentage of Nitrogen varying from 0 to 100% at a power of 3 Watts/cm$^2$. The total deposition time in all cases was 120 minutes. The substrate temperature was, observed to vary from 340K to 473K. Non-stoichiometric films were observed to form at pressure of 12 mTorr and 15 mTorr as well as at 20 mTorr and 25 mTorr. The inter-electrode distance was maintained at 4 cms in each case. The film thickness varied from 116 nm to 600 nm, with the thickness for non-stoichiometric film ranging from 116 nm to 230 nm. In contrast, the thickness of the stoichiometric films formed were significantly higher ranging from 390 nm to 600 nm. The Ti—N 2s band edge (that is the energy at which the first fundamental absorption band occurs, it is equal to 2.33 eV for stoichiometric TiN) was also observed to be higher for non-stoichiometric films compared to stoichiometric films. This shift is accompanied by a shift in the energy band gap values shown in Table 2 and 3. Details of parameters and results obtained are given below in Table 1.

EXAMPLE 2

Evaluation for Transmission

The same methodology as in Example 1 was followed, except that pressure of nitrogen was varied from 15 mTorr to 20 mTorr and the substrate temperature was observed to be 350K and 366K respectively. Results are given below in Table 2. Transmission was observed to be close to 80%.

TABLE 1

Deposition conditions for TiNx ($0.1 \leq x \leq 1.0$)

| Gas Pressure (m Torr) | RF Power density W/cm$^2$ | Inter electrode distance (cm) | Substrate temperature (K) | Deposition time (Min) | Film thickness (nm) | TiN 2s band edge (eV) | Stoichiometry | Substrate |
|---|---|---|---|---|---|---|---|---|
| 12 | 3 | 4 | 340 | 120 | 116 | 3.1 | $TiN_{(0.2<x<0.5)}$ | Fused silica |
| 15 | 3 | 4 | 350 | 120 | 160 | 2.85 | $TiN_{(0.2<x<0.5)}$ | Fused silica |
|  | 3 | 4 | 400 | 120 | 230 | 3.1 | $TiN_{(0.2<x<0.5)}$ | 316LN nuclear grade steel |
| — | 3 | 4 | 473 | 120 | 390 | 2.33 | TiN | 316LN nuclear grade steel |
| — | 3 | 4 | 523 | 120 | 600 | 2.3 | TiN | 316LN nuclear grade steel |
| 20 | 3 | 4 | 366 | 120 | 180 | 2.7 | $TiN_{(0.2<x<0.5)}$ | Fused silica |
| 25 | 3 | 4 | 405 | 120 | 230 | 2.65 | TiN (after annealing at 873 K for one minute) | Fused silica |

TABLE 2

Conditions for transmission close to 80% of TiNx ($0.1 \leq x \leq 1.0$)

| Gas Pressure (m Torr) | RF Power density W/cm$^2$ | Inter electrode distance (cm) | Substrate temperature (K) | Deposition time (Min) | Film thickness (nm) | Band gap (eV) | Substrate |
|---|---|---|---|---|---|---|---|
| 15 | 3 | 4 | 350 | 120 | 160 | 4.4 | Fused silica and sodium borosilicate glass |
| 20 | 3 | 4 | 366 | 120 | 180 | 4.0 | Fused silica and sodium borosilicate glass |

EXAMPLE 3

Band Gap Evaluation—Non-stoichiometric TiNx Film ($0.2 \leq x < 0.5$)

The methodology as in Example 1 was followed. Pressure was varied from 12 to 25 mTorr and the substrate temperature varied from 340 to 405K. The substrate chosen for this experiment was fused silica. The film thickness was varied from 116 nm to 230 nm. The results for band gap evaluation are given below in Table 3. Similarly, evaluation for refractive index was also carried out on another set of TiNx films deposited on fused silica. The results are given below in Table 4.

TABLE 3

| | | | Conditions for large band gap from 3.7 to 4.5 eV | | | | |
|---|---|---|---|---|---|---|---|
| Gas Pressure (mTorr) | RF Power density W/cm$^2$ | Inter electrode distance (cm) | Substrate temperature (K) | Deposition time (Minutes) | Film thickness (nm) | Band gap (eV) | Substrates |
| 12 | 3 | 4 | 340 | 120 | 116 | 4.7 | Fused silica |
| 15 | 3 | 4 | 350 | 120 | 160 | 4.4 | Fused silica |
| 20 | 3 | 4 | 366 | 120 | 180 | 4.0 | Fused silica |
| 25 | 3 | 4 | 405 | 120 | 230 | 3.5 | Fused silica |

TABLE 4

| | | | Conditions for refractive index obtained from 1.5 to 1.9 @ 600 nm | | | | |
|---|---|---|---|---|---|---|---|
| Gas Pressure (mTorr) | RF Power density W/cm$^2$ | Inter electrode distance (cm) | Substrate temperature (K) | Deposition time (Minutes) | Film thickness (nm) | Refractive index in the visible region | Substrate |
| 12 | 3 | 4 | 340 | 120 | 116 | 1.846 | Fused silica |
| 15 | 3 | 4 | 350 | 120 | 160 | 1.78 | Fused silica |
| 20 | 3 | 4 | 366 | 120 | 180 | 1.72 | Fused silica |
| 25 | 3 | 4 | 405 | 120 | 230 | 1.6 | Fused silica |

EXAMPLE 4

Evaluation of Optical Property Stability after Annealing at 873K on Fused Silica Substrates The same methodology as in Example 1 was followed except that the pressure was varied from 12 to 25 mTorr and the substrate temperature varied from 340 to 405K. The substrate chosen for this experiment was fused silica. The film thickness was varied from 116 nm to 230 nm. The films were annealed at 873K and the refractive index and absorption edge were evaluated on the films both after deposition and then again after annealing. The results are given below in Table 5.

TABLE 5

Optical property stability after annealing at 873 K on fused silica substrates

| Gas Pressure (m Torr) | RF Power density W/cm² | Inter electorde distance (cm) | Substrate temperature (K) | Deposition time (Min) | Film thickness (nm) | | Refractive index (n) | | Band gap (eV) | |
|---|---|---|---|---|---|---|---|---|---|---|
| | | | | | As deposited | Anneal @873 K | As deposited | Anneal @873 K | As deposited | Anneal @873 K |
| 12 | 3 | 4 | 340 | 120 | 116 | 111 | 1.846 | 1.85 | 4.7 | 4.7 |
| 15 | 3 | 4 | 350 | 120 | 160 | 155 | 1.78 | 1.8 | 4.4 | 4.3 |
| 20 | 3 | 4 | 366 | 120 | 180 | 161 | 1.72 | 1.74 | 4.0 | 3.4 |
| 25 | 3 | 4 | 405 | 120 | 230 | 198 | 1.6 | 1.70 | 3.5 | 2.9 |

EXAMPLE 5

Evaluation of Reflectance on Steel Substrates

Methodology as in example 1 was followed. The substrate was stainless steel 316LN nuclear grade steel. Parameters for pressure, power, inter electrode distance, measured substrate temperature during deposition, film thickness, band edge and deposition time are given in Table 6 along with results for reflectance.

TABLE 6

Conditions for lowest reflectance on steel substrates

| Gas Pressure (m Torr) | RF Power density W/cm² | Inter electrode distance (cm) | Substrate temperature (K) | Deposition time (Min) | Film thickness Nm | TiN 2s band edge eV | Reflectance (%) | Substrate |
|---|---|---|---|---|---|---|---|---|
| 15 (100%) NZ | 3 | 4 | 350 | 120 | 250 | 3.1 | <2% | 316LN nuclear grade steel |

EXAMPLE 6

Formation of Colored Films

Methodology as in example 1 was followed. The substrate was fused silica and 316LN nuclear grade steel respectively. Gas pressure was 100% nitrogen and substrate temperature was observed to be 340K and 350K. Films formed were yellow, brown and deep blue. Detailed parameters and results are given in Tables 7, 8 and 9 respectively.

TABLE 7

Conditions for YELLOW colored films

| Gas Pressure (m Torr) | RF Power density W/cm² | Inter electrode distance (cm) | Substrate temperature (K) | Deposition time (Min) | Film thickness Nm | Colour | Substrate |
|---|---|---|---|---|---|---|---|
| 12 (100%) NZ | 3 | 4 | 340 | 120 | 116 60 (Fused silica) 230 (316LN steel) 65 | YELLOW | 316LN nuclear grade steel and Fused silica |

TABLE 8

Conditions for the BROWN colored films

| Gas Pressure (m Torr) | RF Power density W/cm² | Inter electrode distance (cm) | Substrate temperature (K) | Deposition time (Min) | Film thickness Nm | Colour | Substrate |
|---|---|---|---|---|---|---|---|
| 12 (100%) NZ | 3 | 4 | 350 | 120 | 120 (Fused silica) 400 (316LN steel) | BROWN | 316LN nuclear grade steel and Fused silica |

TABLE 9

Conditions for the DEEP BLUE colored films

| Gas Pressure (m Torr) | RF Power density W/cm² | Inter electrode distance (cm) | Substrate temperature (K) | Deposition time (Min) | Film thickness Nm | Colour | Substrate |
|---|---|---|---|---|---|---|---|
| 20 (100%) NZ | 3 | 4 | 350 | 120 | 120 (Fused silica) 400 (316LN steel) | DEEP BLUE | 316LN nuclear grade steel and Fused silica |
| 25 | 3 | 4 | 350 | 120 | 190 to 230 (Fused silica) 300 to 1000 (316LN steel) | DEEP BLUE | 316LN nuclear grade steel and Fused silica |

EXAMPLE 7

Evaluation of Hardness of TiNx Non-stoichiometric Films

The same methodology as in Example 1 was followed. The substrate used for deposition was fused silica. The operational parameters and the results obtained are given below in Table 10.

TABLE 10

Conditions for hardness ranging from 5 to 7.5 GPa

| Gas Pressure (m Torr) | RF Power density W/cm² | Inter electrode distance (cm) | Substrate temperature (K) | Deposition time (Min) | Film thickness Nm | Film Hardness GPa | Substrate |
|---|---|---|---|---|---|---|---|
| 12 | 3 | 4 | 340 | 120 | 111 | 5.1 | Fused Silica |
| 15 | 3 | 4 | 350 | 120 | 155 | 6.2 | Fused Silica |
| 20 | 3 | 4 | 366 | 120 | 161 | 6.8 | Fused Silica |
| 25 | 3 | 4 | 405 | 120 | 198 | 7.5 | Fused Silica |

EXAMPLE 8

Evaluation of Crystallization of TiN Films on Different Substrates

The same methodology as in example 1 was followed. The operational parameters and results obtained are given in Table 11 below.

TABLE 11

| | | | | | Film thickness | | |
|---|---|---|---|---|---|---|---|
| Gas Pressure (m Torr) | RF Power density W/cm² | Inter electrode distance (cm) | Substrate temperature (K) | Deposition time (Min) | Annealed @ 873K Nm | Crystallinity | Substrate |
| 15 | 3 | 4 | 400 | 120 | 230 | Amorphous | 316LN nuclear grade steel |
| | 3 | 4 | 473 | 120 | 400 | Nano Crystalline | 316LN nuclear grade steel |
| | 3 | 4 | 523 | 120 | 600 | Nano Crystalline | 316LN nuclear grade steel |
| 25 | 3 | 4 | Annealed film at 873K for 1 min | 120 | 198 | Ti₂N Nano Crystalline | Fused Silica |

Conditions for crystallization of TiN films on different substrates

We claim:

1. A process for the manufacture of a transparent, large band gap, high refractive index and high temperature stable, non-stoichiometric titanium nitride thin film for optical and optoelectronic devices comprising the steps of preparing the non-stoichiometric titanium nitride thin film by RF magnetron sputter deposition of non-stoichiometric titanium nitride having a formula $TiN_x$ $0.1<x<1.0$ in an atmosphere consisting of 100% nitrogen at a RF power density ranging from 0.5 to 3 Watts/cm², as a thin layer on a substrate selected from stainless steel, amorphous fused silica, magnesium oxide, lanthanum aluminate and sodium borosilicate glass, the RF magnetron sputter deposition of the thin layer on the substrate being carried out at temperature between 340 K and 523 K, the RF magnetron sputter deposition being controlled by varying a nitrogen pressure from 12 to 25 mTorr, wherein the non-stoichiometric titanium nitride thin film so formed has an optical band gap between 3.7 and 4.5 eV.

2. A process as claimed in claim 1 wherein the non-stoichiometric titanium nitride thin film is formed at a nitrogen pressure of 15 mTorr on stainless steel substrates.

3. A process as claimed in claim 1 wherein the nitrogen pressure is varied to control the porosity and thickness between 100 to 1000 nm and obtain the non-stoichiometric titanium nitride thin film having a hardness in a range of from 5 to 7.5 GPa.

4. A process as claimed in claim 1 wherein the non-stoichiometric titanium nitride thin film after deposition is subjected to annealing at 873 K.

5. A process as claimed in claim 1, wherein the non-stoichiometric titanium nitride thin film so formed has an optical transmission greater than 80%, and the non-stoichiometric titanium nitride thin film is formed in different colors selected from brown, blue, magenta, and yellow, and a refractive index in the range of 1.6 to 1.9 at a wavelength of 600 nm, where x in $TiN_x$ is between 0.5 and 1.

6. A process as claimed in claim 1, wherein the non-stoichiometric titanium nitride thin film so formed has a specular reflectance of less than 2% at wavelengths between 400 and 600 nm.

7. A process as claimed in claim 1 wherein the non-stoichiometric titanium nitride has the formula $TiN_x$ $0.2 \leq x \leq 0.5$.

* * * * *